US009620073B2

(12) United States Patent
Hao

(10) Patent No.: US 9,620,073 B2
(45) Date of Patent: Apr. 11, 2017

(54) LIQUID CRYSTAL DISPLAY DEVICE AND GATE DRIVING CIRCUIT THEREOF

(71) Applicant: Shenzhen China Star Optoelectronics Technology Co., Ltd., Shenzhen, Guangdong (CN)

(72) Inventor: Sikun Hao, Guangdong (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 170 days.

(21) Appl. No.: 14/433,657

(22) PCT Filed: Jan. 12, 2015

(86) PCT No.: PCT/CN2015/070517
§ 371 (c)(1),
(2) Date: Apr. 4, 2015

(87) PCT Pub. No.: WO2016/106823
PCT Pub. Date: Jul. 7, 2016

(65) Prior Publication Data
US 2016/0343334 A1 Nov. 24, 2016

(30) Foreign Application Priority Data

Dec. 30, 2014 (CN) .......................... 2014 1 0850940

(51) Int. Cl.
*G09G 3/36* (2006.01)
*G11C 19/28* (2006.01)
*G11C 19/18* (2006.01)

(52) U.S. Cl.
CPC .......... *G09G 3/3677* (2013.01); *G11C 19/184* (2013.01); *G11C 19/28* (2013.01); *G09G 2310/0286* (2013.01); *G09G 2310/08* (2013.01)

(58) Field of Classification Search
CPC ......... G09G 3/3677; G09G 2300/0408; G09G 2320/043; G09G 2310/0286; G09G 2310/08; G11C 19/184; G11C 19/28
See application file for complete search history.

(56) References Cited

U.S. PATENT DOCUMENTS 8,537,094 B2 * 9/2013 Yang .................... G09G 3/3677
345/100
2009/0278785 A1 * 11/2009 Chin-Cheng ........ G09G 3/3677
345/100

* cited by examiner

*Primary Examiner* — Nelson Rosario
(74) *Attorney, Agent, or Firm* — Andrew C. Cheng

(57) ABSTRACT

A liquid crystal display device and a gate driving circuit are provided. The gate driving circuit includes shift register circuits cascade-connected in series. Each shift register circuit includes: first and second pull-up circuits, first and second pull-down circuits and a pull-down control circuit. The first and second pull-up circuits are electrically connected in series between a preceding-stage gate driving signal and a gate driving signal output terminal. The first and second pull-down circuits and the pull-down control circuit are electrically connected with the first and second pull-up circuits in parallel. The pull-down control circuit is electrically coupled to the preceding-stage gate driving signal, the first and second pull-down circuits and first and second voltage levels and for controlling the first and second pull-down circuits according to the preceding-stage gate driving signal. Accordingly, the invention is suitable for CMOS process and can increase circuit stability.

8 Claims, 4 Drawing Sheets

LIQUID CRYSTAL DISPLAY DEVICE AND GATE DRIVING CIRCUIT THEREOF

TECHNICAL FIELD

The invention relates to the field of liquid crystal display technology, and particularly to a liquid crystal display device and a gate driving circuit thereof.

DESCRIPTION OF RELATED ART

A GOA (gate driver on array) circuit technology uses an array process of conventional liquid crystal display device to manufacture a gate scan driving circuit on an array substrate and thereby to achieve a progressive scan driving mode. The GOA circuit has advantages of reduced production cost and narrow-border design and thus is used for a variety of display devices. The GOA circuit needs to have two basic functions: a first one is to input gate driving signals to drive gate lines in a panel and thereby switch on TFTs (thin film transistors) in a display area to allow data lines to charge pixels; and a second one is shift register function, so that when the output of an nth gate driving signal is completed, it subsequently carries out the output of the (n+1)th gate driving signal by clock control; and the like.

The GOA circuit includes a pull-up circuit, a pull-up control circuit, a pull-down circuit, a pull-down control circuit and a boost circuit responsible for potential lift-up. In particular, the pull-up circuit mainly is responsible for outputting an inputted clock signal to a gate of a thin film transistor as a driving signal of a liquid crystal display device. The pull-up control circuit is responsible for controlling the pull-up circuit to be switched on and generally is subjected to the control of a signal delivered from a preceding-stage GOA circuit. The pull-down circuit is responsible for quickly pulling down a scan signal to a low voltage level after outputting the scan signal, i.e., pulling down the potential of the gate of the thin film transistor to the low voltage level. The pull-down control circuit is responsible for maintaining the scan signal and a signal of the pull-up circuit (generally referred to as Q node signal) at a switched-off state (i.e., a set negative potential) and generally has two pull-down maintaining circuits which alternately work. The boost circuit is responsible for lifting up the potential at the Q node once again so as to ensure the normal output of G(N) of the pull-up circuit.

Different GOA circuits may use different manufacturing processes. The LTPS (low temperature poly-silicon) process has advantages of high electron mobility and mature technology and thus currently has been widely used by small and medium-sized display devices. The CMOS (complementary metal oxide semiconductor) LTPS process has advantages of low power consumption, high electron mobility and wide noise tolerance, etc., and thus has been gradually used by panel makers. Accordingly, there is a need of developing a GOA circuit corresponding to the CMOS LTPS process.

SUMMARY

Accordingly, embodiments of the invention provide a liquid crystal display device and a gate driving circuit, which are suitable for CMOS process and can increase circuit stability.

In particular, the invention provides a gate driving circuit including a plurality of shift register circuit. The plurality of shift register circuits are cascade-connected in series. Each of the plurality of shift register circuits includes: a first pull-up circuit, a second pull-up circuit, a first pull-down circuit, a second pull-down circuit and a pull-down control circuit. The first pull-up circuit and the second pull-up circuit are electrically connected in series between a preceding-stage gate driving signal and a gate driving signal output terminal. The first pull-down circuit, the second pull-down circuit and the pull-down control circuit are electrically connected with the first pull-up circuit and the second pull-up circuit in parallel. The pull-down control circuit is electrically coupled to the preceding-stage gate driving signal, the first pull-down circuit, the second pull-down circuit, a first voltage level and a second voltage level. Moreover, the pull-down control circuit is configured for controlling the first pull-down circuit and the second pull-down circuit according to the preceding-stage gate driving signal.

In an embodiment, the shift register circuit further includes a first capacitor and a second capacitor. The first pull-up circuit includes a first transistor; a gate and a sourced of the first transistor are electrically connected to receive the preceding-stage gate driving signal. The second pull-up circuit includes a second transistor; a gate of the second transistor is electrically connected to a drain of the first transistor, a source of the second transistor is electrically connected to receive a first clock signal, and a drain of the second transistor is electrically connected to the gate driving signal output terminal. The first capacitor is electrically connected between the drain and the gate of the second transistor. The first pull-down circuit includes a third transistor; a source of the third transistor is electrically connected to the gate driving signal output terminal, and a drain of the third transistor is electrically connected to the first voltage level. The second pull-down circuit includes a fourth transistor; a source of the fourth transistor is electrically connected to the drain of the first transistor, and a drain of the fourth transistor is electrically connected to the first voltage level. A terminal of the second capacitor is electrically connected to the first voltage level, and another terminal of the second capacitor is electrically connected to the gate of the third transistor and the gate of the fourth transistor.

In an embodiment, the pull-down control circuit includes: a fifth transistor, a gate of the fifth transistor being electrically connected to receive the preceding-stage gate driving signal, a source of the fifth transistor being electrically connected to the first voltage level, and a drain of the fifth transistor being electrically connected to the gate of the third transistor and the gate of the fourth transistor; a sixth transistor, a gate of the sixth transistor being electrically connected to receive the preceding-stage gate driving signal, and a source of the sixth transistor being electrically connected to the first voltage level; a seventh transistor, a gate of the seventh transistor being electrically connected to a drain of the sixth transistor, a source of the seventh transistor being electrically connected to the second voltage level, and a drain of the seventh transistor being electrically connected to the drain of the fifth transistor; a third capacitor electrically connected between the source and the gate of the seventh transistor; and an eighth transistor, a gate and a drain of the eighth transistor being electrically connected to the second voltage level, and a source of the eighth transistor being electrically connected to the drain of the sixth transistor.

In an embodiment, the first voltage level is a high voltage level, and the second voltage level is a low voltage level; that is, the first voltage level is higher than the second voltage level.

In an embodiment, the first transistor, the second transistor, the third transistor, the fourth transistor, the fifth transistor, the sixth transistor, the seventh transistor and the eighth transistor all are P-type MOS transistors.

The invention further provides a liquid crystal display device including a liquid crystal display panel and a gate driving circuit. The gate driving circuit is electrically connected to the liquid crystal display panel and for supplying scan driving signals to the liquid crystal display panel. The gate driving circuit includes a plurality of shift register circuits cascade-connected in series. Each of the plurality of shift register circuits includes: a first pull-up circuit, a second pull-up circuit, a first pull-down circuit, a second pull-down circuit and a pull-down control circuit. The first pull-up circuit and the second pull-up circuit are electrically connected in series between a preceding-stage gate driving signal and a gate driving signal output terminal. The first pull-down circuit, the second pull-down circuit and the pull-down control circuit are electrically connected with the first pull-up circuit and the second pull-up circuit in parallel. The pull-down control circuit is electrically coupled to the preceding-stage gate driving signal, the first pull-down circuit, the second pull-down circuit, a first voltage level and a second voltage level. Moreover, the pull-down control circuit is configured for controlling the first pull-down circuit and the second pull-down circuit according to the preceding-stage gate driving signal.

In an embodiment, the shift register circuit further includes a first capacitor and a second capacitor. The first pull-up circuit includes a first transistor; a gate and a sourced of the first transistor are electrically connected to receive the preceding-stage gate driving signal. The second pull-up circuit includes a second transistor; a gate of the second transistor is electrically connected to a drain of the first transistor, a source of the second transistor is electrically connected to receive a first clock signal, and a drain of the second transistor is electrically connected to the gate driving signal output terminal. The first capacitor is electrically connected between the drain and the gate of the second transistor. The first pull-down circuit includes a third transistor; a source of the third transistor is electrically connected to the gate driving signal output terminal, and a drain of the third transistor is electrically connected to the first voltage level. The second pull-down circuit includes a fourth transistor; a source of the fourth transistor is electrically connected to the drain of the first transistor, and a drain of the fourth transistor is electrically connected to the first voltage level. A terminal of the second capacitor is electrically connected to the first voltage level, and another terminal of the second capacitor is electrically connected to the gate of the third transistor and the gate of the fourth transistor.

In an embodiment, the pull-down control circuit includes: a fifth transistor, a gate of the fifth transistor being electrically connected to receive the preceding-stage gate driving signal, a source of the fifth transistor being electrically connected to the first voltage level, and a drain of the fifth transistor being electrically connected to the gate of the third transistor and the gate of the fourth transistor; a sixth transistor, a gate of the sixth transistor being electrically connected to receive the preceding-stage gate driving signal, and a source of the sixth transistor being electrically connected to the first voltage level; a seventh transistor, a gate of the seventh transistor being electrically connected to a drain of the sixth transistor, a source of the seventh transistor being electrically connected to the second voltage level, and a drain of the seventh transistor being electrically connected to the drain of the fifth transistor; a third capacitor electrically connected between the source and the gate of the seventh transistor; and an eighth transistor, a gate and a drain of the eighth transistor being electrically connected to the second voltage level, and a source of the eighth transistor being electrically connected to the drain of the sixth transistor.

In an embodiment, the first voltage level is a high voltage level, and the second voltage level is a low voltage level.

In an embodiment, the first transistor, the second transistor, the third transistor, the fourth transistor, the fifth transistor, the sixth transistor, the seventh transistor and the eighth transistor all are P-type MOS transistors.

By the above solutions, the efficacy can be achieved by the invention is that: the pull-down control circuit of the invention is electrically coupled to the preceding-stage gate driving signal, the first pull-down circuit, the second pull-down circuit, the first voltage level and the second voltage level, and the pull-down control circuit further controls the first pull-down circuit and the second pull-down circuit according to the preceding-stage gate driving signal. Accordingly, the invention is suitable for CMOS process and can increase circuit stability.

BRIEF DESCRIPTION OF THE DRAWINGS

In order to more clearly illustrate the technical solutions of various embodiments of the present invention, drawings will be used in the description of embodiments will be given a brief description below. Apparently, the drawings in the following description only are some embodiments of the invention, the ordinary skill in the art can obtain other drawings according to these illustrated drawings without creative effort. In the drawings.

DETAILED DESCRIPTION OF EMBODIMENTS

In the following, with reference to accompanying drawings of embodiments of the invention, technical solutions in the embodiments of the invention will be clearly and completely described. Apparently, the embodiments of the invention described below only are a part of embodiments of the invention, but not all embodiments. Based on the described embodiments of the invention, all other embodiments obtained by ordinary skill in the art without creative effort belong to the scope of protection of the invention.

Figure 1:
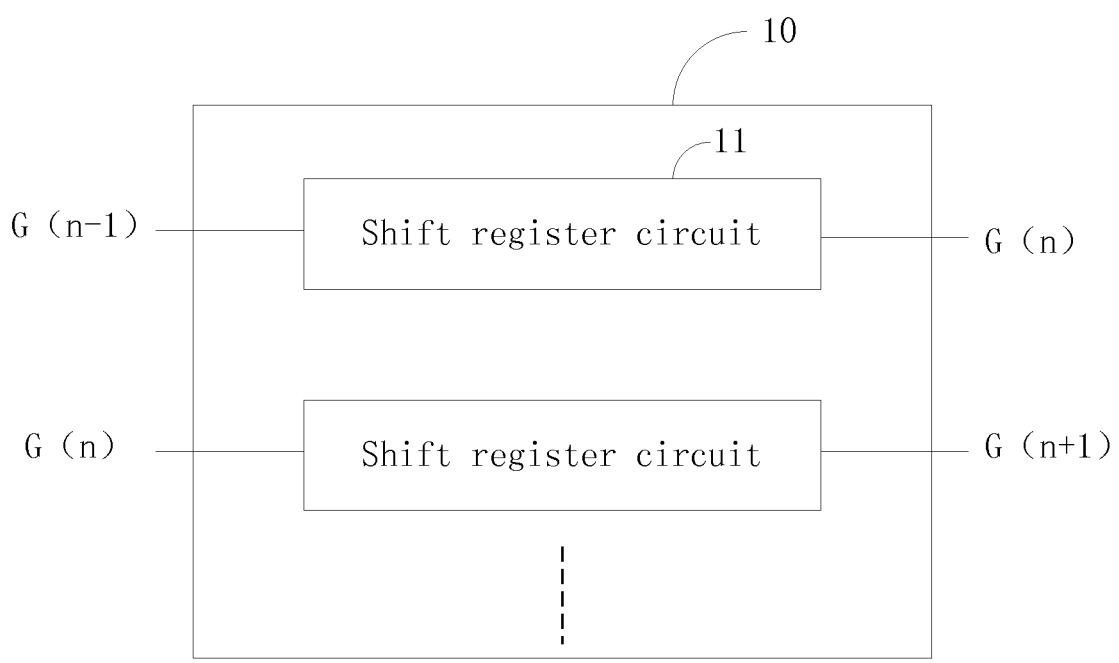
FIG. 1 is a structural schematic view of a gate driving circuit of an embodiment of the invention.

Referring to FIG. 1, which is a structural schematic view of a gate driving circuit of an embodiment of the invention. As shown in FIG. 1, the gate driving circuit 10 provided in this embodiment includes a plurality of shift register circuits 11. The plurality of shift register circuits 11 are cascade-connected in series.

Figure 2:
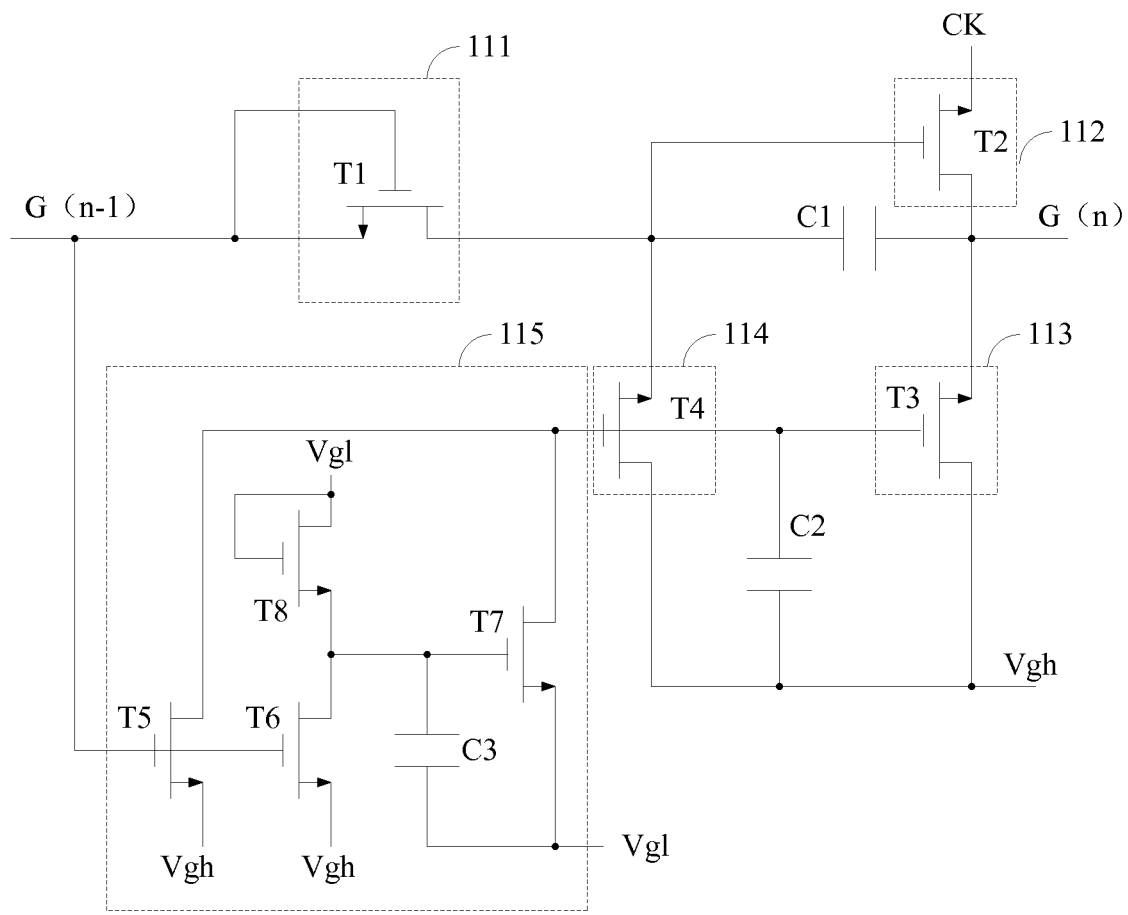
FIG. 2 is a circuit diagram of a shift register circuit as shown in FIG. 1.

As shown in FIG. 2, the shift register circuit 11 includes a first pull-up circuit 111, a second pull-up circuit 112, a first pull-down circuit 113, a second pull-down circuit 114, a pull-down control circuit 115, a first capacitor C1, a second capacitor C2 and a third capacitor C3. The first pull-up circuit 111 and the second pull-up circuit 112 are electrically connected in series between a preceding-stage gate driving signal G(n−1) and a gate driving signal output terminal G(n). The first pull-down circuit 113, the second pull-down circuit 114 and the pull-down control circuit 115 are electrically connected with the first pull-up circuit 111 and the second pull-up circuit 112 in parallel. The pull-down control circuit 115 is electrically coupled to the preceding-stage gate driving signal G(n−1), the first pull-down circuit 113, the second pull-down circuit 114, a first voltage level Vgh and a second voltage level Vgl. The pull-down control circuit 115 is configured for controlling the first pull-down circuit 113 and the second pull-down circuit 114 according to the preceding-stage gate driving signal G(n−1).

The first pull-up circuit 111 includes a first transistor T1. A gate and a source of the first transistor T1 are electrically connected to receive the preceding-stage gate driving signal G(n−1). The second pull-up circuit 112 includes a second transistor T2. A gate of the second transistor T2 is electrically connected to a drain of the first transistor T1, a source of the second transistor T2 is electrically connected to receive a first clock signal CK, a drain of the second transistor T2 is electrically connected to the gate driving signal output terminal G(n), and the first capacitor C1 is electrically connected between the gate and the drain of the second transistor T2. The first pull-down circuit 113 includes a third transistor T3. A source of the third transistor T3 is electrically connected to the gate driving signal output terminal G(n), and a drain of the third transistor T3 is electrically connected to the first voltage level Vgh. The second pull-down circuit 114 includes a fourth transistor T4. A source of the fourth transistor T4 is electrically connected to the drain of the first transistor T1, and a drain of the fourth transistor T4 is electrically connected to the first voltage level Vgh. A terminal of the second capacitor C2 is electrically connected to the first voltage level Vgh, and another terminal of the second capacitor C2 is electrically connected to the gate of the third transistor T3 and the gate of the fourth transistor T4. The pull-down control circuit 115 is electrically coupled to the preceding-stage gate driving signal G(n−1), the gate of the third transistor T3, the gate of the fourth transistor T4, the first voltage level Vgh and the second voltage level Vgl. The pull-down control circuit 115 controls operations of the third transistor T3 and the fourth transistor T4 according to the preceding-stage gate driving signal G(n−1), i.e., controls the third transistor T3 and the fourth transistor T4 to be switched-on or switched-off.

The pull-down control circuit 115 includes a fifth transistor T5, a sixth transistor T6, a seventh transistor T7 and an eighth transistor T8. A gate of the fifth transistor T5 is electrically connected to receive the preceding-stage gate driving signal G(n−1), a source of the fifth transistor T5 is electrically connected to the first voltage level Vgh, and a drain of the fifth transistor T5 is electrically connected to the gate of the third transistor T3 and the gate of the fourth transistor T4. A gate of the sixth transistor T6 is electrically connected to receive the preceding-stage gate driving signal G(n−1), and a source of the sixth transistor T6 is electrically connected to the first voltage level Vgh. A gate of the seventh transistor T7 is electrically connected to a drain of the sixth transistor T6, a source of the seventh transistor T7 is electrically connected to the second voltage level Vgl, a drain of the seventh transistor T7 is electrically connected to a drain of the fifth transistor T5, and the third capacitor C3 is electrically connected between the source and the gate of the seventh transistor T7. A gate and a drain of the eighth transistor T8 are electrically connected to the second voltage level Vgl, and a source of the eighth transistor T8 is electrically connected to the drain of the sixth transistor T6.

In this embodiment, the first voltage level Vgh preferably is a high voltage level, and the second voltage level Vgl preferably is a low voltage level. The first transistor T1, the second transistor T2, the third transistor T3, the fourth transistor T4, the fifth transistor T5, the sixth transistor T6, the seventh transistor T7 and the eighth transistor T8 all are P-type MOS transistors, and in other embodiment, the skilled person in the art can use other field effect transistors such as N-type MOS transistors as the above transistors.

Figure 3:
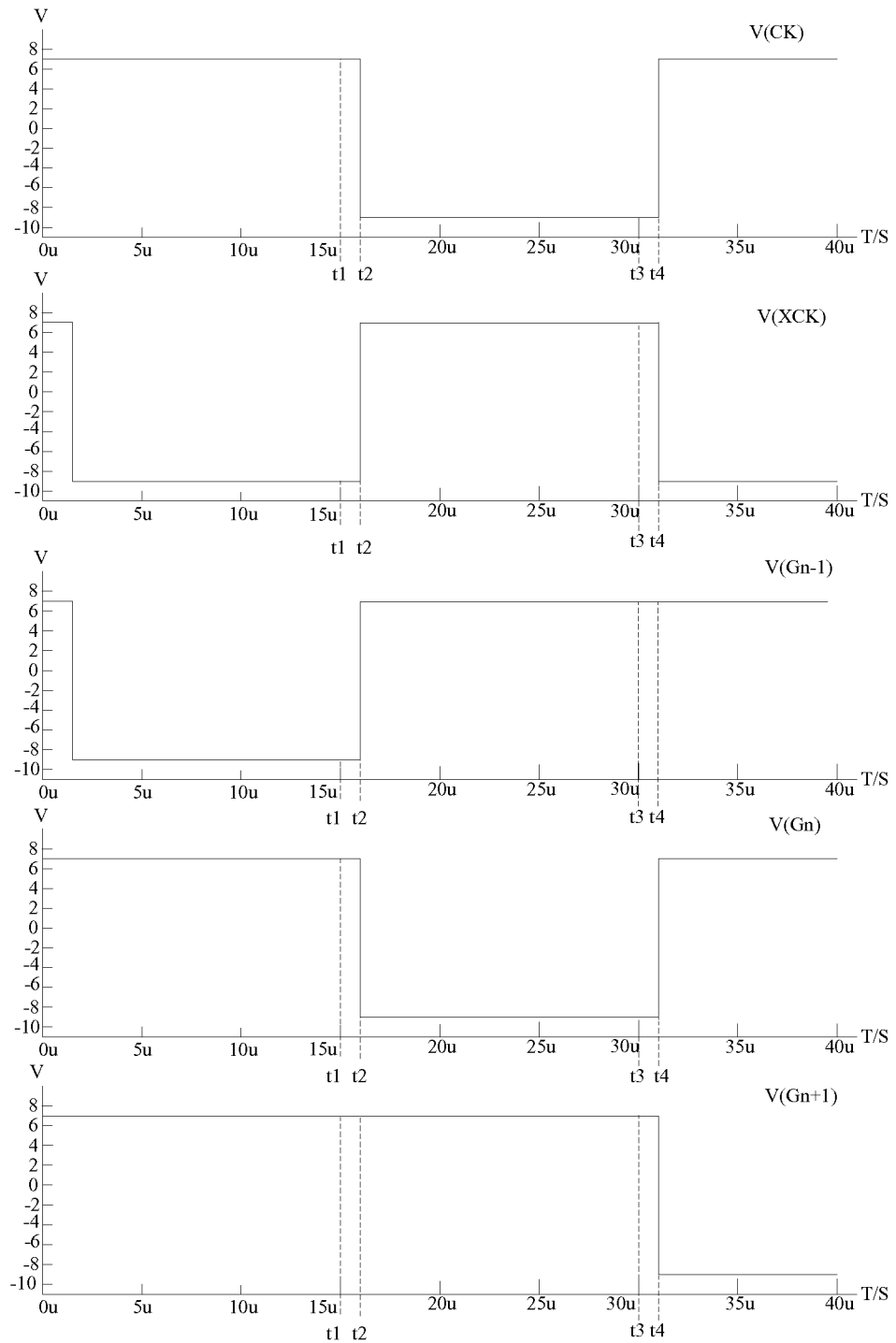
FIG. 3 is a simulation timing diagram of the gate driving circuit as shown in FIG. 1.

An operation principle of the gate driving circuit 10 will be described below in detail with reference to a timing diagram as shown in FIG. 3.

At a first moment t1, the preceding-stage gate driving signal G(n−1) is a low voltage level, the first transistor T1 is switched-on, the first clock signal CK is a high voltage level, the gate of the second transistor T2 is at a low voltage level, the second transistor T2 is switched-on; the fifth transistor T5 and the sixth transistor T6 both are switched-on, the gate of the seventh transistor T7 and the source of the eighth transistor T8 both are at high voltage levels, the seventh transistor T7 is switched-off, the eighth transistor T8 is switched-on; the gate of the third transistor T3 and the gate of the fourth transistor T4 both are at high voltage levels, the third transistor T3 and the fourth transistor T4 both are switched-off; and therefore, an output signal of the gate driving signal output terminal G(n) is the same as the first clock signal CK, i.e., the output signal of the gate driving signal output terminal G(n) is a high voltage level.

At a second moment t2, the preceding-stage gate driving signal G(n−1) is changed from the low voltage level to a high voltage level, the first transistor T1 is switched-off, the first clock signal CK is changed from the high voltage level to a low voltage level, the second transistor T2 is switched-on; the fifth transistor T5, the sixth transistor T6, the seventh transistor T7 and the eighth transistor T8 all are switched-off, the third transistor T3 and the fourth transistor T4 both are switched-off; and therefore, an output signal of the gate driving signal output terminal G(n) is the same as the first clock signal CK, i.e., the output signal of the gate driving signal output terminal G(n) is changed from the high voltage level to a low voltage level.

At a third moment t3, the preceding-stage gate driving signal G(n−1) is the high voltage level, the first transistor T1 is switched off, the first clock signal CK is the low voltage level, the second transistor T2 is switched-on; the fifth transistor T5, the sixth transistor T6, the seventh transistor T7 and the eighth transistor T8 all are switched-off; the third transistor T3 and the fourth transistor T4 both are switched-off; and therefore, the output signal of the gate driving signal output terminal G(n) is the same as the first clock signal CK, i.e., the output signal of the gate driving signal output terminal G(n) is the low voltage level.

At a fourth moment t4, the preceding-stage gate driving signal G(n−1) is the high voltage level, the first transistor T1 is switched-off, the first clock signal CK is changed from the low voltage level to the high voltage level, the second transistor T2 is switched-on; the fifth transistor T5 and the sixth transistor T6 both are switched-off, the eighth transistor T8 is switched-on, the seventh transistor T7 is switched-on, the gate of the third transistor T3 and the gate of the fourth transistor T4 both are at the low voltage levels, the third transistor T3 and the fourth transistor T4 both are switched-on, the output signal of the gate driving signal output terminal G(n) continuously is the high voltage level.

This embodiment uses the pull-down control circuit 115 to electrically couple with the preceding-stage gate driving signal G(n−1), the gate of the third transistor T3, the gate of the fourth transistor T4, the first voltage level Vgh and the second voltage level Vgl, the pull-down control circuit 115 can control the third transistor T3 and the fourth transistor T4 according to the preceding-stage gate driving signal G(n−1), and therefore this embodiment is suitable for CMOS process and can increase circuit stability as well as reduce the number of clock signal.

Figure 4:
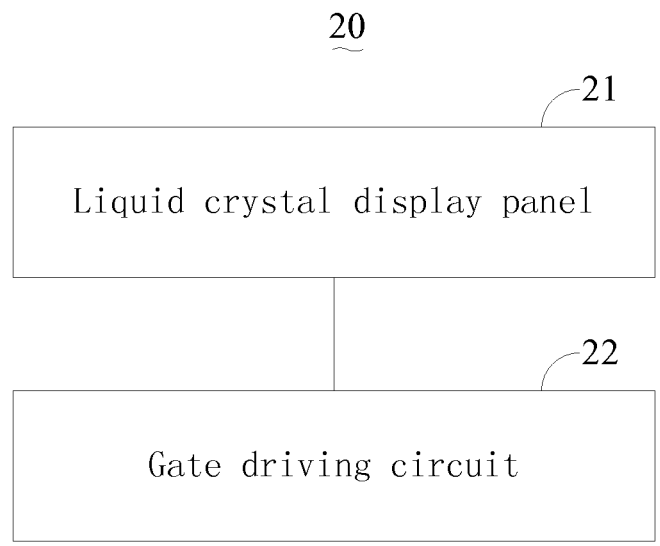
FIG. 4 is a structural schematic view of a liquid crystal display device of an embodiment of the invention.

In addition, the invention further provides a liquid crystal display device. As shown in FIG. 4, the liquid crystal display device 20 provided by this embodiment includes a liquid crystal display panel 21 and a gate driving circuit 22. The gate driving circuit 22 is electrically connected with the liquid crystal display panel 21. The gate driving circuit 22 is configured (i.e., structured and arranged) for providing scan driving signals for the liquid crystal display panel 21. The gate driving circuit 22 is the gate driving circuit 10 as described in above embodiment, and thus will not be repeated herein.

In summary, the pull-down control circuit of the invention is electrically coupled to the preceding-stage gate driving signal, the third transistor, the fourth transistor, the first voltage level and the second voltage level, and the pull-down control circuit can control the third transistor and the fourth transistor according to the preceding-stage gate driving signal, and therefore it is suitable for CMOS process and can increase circuit stability.

While the invention has been described in terms of what is presently considered to be the most practical and preferred embodiments, it is to be understood that the invention needs not be limited to the disclosed embodiments. On the contrary, it is intended to cover various modifications and similar arrangements included within the spirit and scope of the appended claims which are to be accorded with the broadest interpretation so as to encompass all such modifications and similar structures.

What is claimed is:

1. A gate driving circuit comprising a plurality of shift register circuits, the plurality of shift register circuits being cascade-connected in series, each of the plurality of shift register circuits comprising:
    a first pull-up circuit, a second pull-up circuit, a first pull-down circuit, a second pull-down circuit and a pull-down control circuit;
    wherein the first pull-up circuit and the second pull-up circuit are electrically connected in series between a preceding-stage gate driving signal and a gate driving signal output terminal; the first pull-down circuit, the second pull-down circuit and the pull-down control circuit are electrically connected with the first pull-up circuit and the second pull-up circuit in parallel; the pull-down control circuit is electrically coupled to the preceding-stage gate driving signal, the first pull-down circuit, the second pull-down circuit, a first voltage level and a second voltage level; and the pull-down control circuit is configured for controlling the first pull-down circuit and the second pull-down circuit according to the preceding-stage gate driving signal;
    wherein the shift register circuit further comprises a first capacitor and a second capacitor;
    the first pull-up circuit comprises a first transistor, a gate and a sourced of the first transistor are electrically connected to receive the preceding-stage gate driving signal;
    the second pull-up circuit comprises a second transistor, a gate of the second transistor is electrically connected to a drain of the first transistor, a source of the second transistor is electrically connected to receive a first clock signal, and a drain of the second transistor is electrically connected to the gate driving signal output terminal;
    the first capacitor is electrically connected between the drain and the gate of the second transistor;
    the first pull-down circuit comprises a third transistor, a source of the third transistor is electrically connected to the gate driving signal output terminal, and a drain of the third transistor is electrically connected to the first voltage level;
    the second pull-down circuit comprises a fourth transistor, a source of the fourth transistor is electrically connected to the drain of the first transistor, and a drain of the fourth transistor is electrically connected to the first voltage level;
    a terminal of the second capacitor is electrically connected to the first voltage level, and another terminal of the second capacitor is electrically connected to the gate of the third transistor and the gate of the fourth transistor.

2. The gate driving circuit as claimed in claim 1, wherein the pull-down control circuit comprises:
    a fifth transistor, a gate of the fifth transistor being electrically connected to receive the preceding-stage gate driving signal, a source of the fifth transistor being electrically connected to the first voltage level, and a drain of the fifth transistor being electrically connected to the gate of the third transistor and the gate of the fourth transistor;
    a sixth transistor, a gate of the sixth transistor being electrically connected to receive the preceding-stage gate driving signal, and a source of the sixth transistor being electrically connected to the first voltage level;
    a seventh transistor, a gate of the seventh transistor being electrically connected to a drain of the sixth transistor, a source of the seventh transistor being electrically connected to the second voltage level, and a drain of the seventh transistor being electrically connected to the drain of the fifth transistor;
    a third capacitor, electrically connected between the source and the gate of the seventh transistor;
    an eighth transistor, a gate and a drain of the eighth transistor being electrically connected to the second voltage level, and a source of the eighth transistor being electrically connected to the drain of the sixth transistor.

3. The gate driving circuit as claimed in claim 2, wherein the first voltage level is a high voltage level, and the second voltage level is a low voltage level.

4. The gate driving circuit as claimed in claim 3, wherein the first transistor, the second transistor, the third transistor, the fourth transistor, the fifth transistor, the sixth transistor, the seventh transistor and the eighth transistor all are P-type MOS transistors.

5. A liquid crystal display device comprising a liquid crystal display panel and a gate driving circuit, the gate driving circuit being electrically connected to the liquid crystal display panel and for supplying scan driving signals to the liquid crystal display panel, the gate driving circuit comprising a plurality of shift register circuits cascade-connected in series, each of the plurality of shift register circuits comprising:
    a first pull-up circuit, a second pull-up circuit, a first pull-down circuit, a second pull-down circuit and a pull-down control circuit;
    wherein the first pull-up circuit and the second pull-up circuit are electrically connected in series between a preceding-stage gate driving signal and a gate driving signal output terminal; the first pull-down circuit, the second pull-down circuit and the pull-down control circuit are electrically connected with the first pull-up circuit and the second pull-up circuit in parallel; the pull-down control circuit is electrically coupled to the preceding-stage gate driving signal, the first pull-down circuit, the second pull-down circuit, a first voltage level and a second voltage level; and the pull-down control circuit is configured for controlling the first pull-down circuit and the second pull-down circuit according to the preceding-stage gate driving signal;

wherein the shift register circuit further comprises a first capacitor and a second capacitor;

the first pull-up circuit comprises a first transistor, a gate and a sourced of the first transistor are electrically connected to receive the preceding-stage gate driving signal;

the second pull-up circuit comprises a second transistor, a gate of the second transistor is electrically connected to a drain of the first transistor, a source of the second transistor is electrically connected to receive a first clock signal, and a drain of the second transistor is electrically connected to the gate driving signal output terminal;

the first capacitor is electrically connected between the drain and the gate of the second transistor;

the first pull-down circuit comprises a third transistor, a source of the third transistor is electrically connected to the gate driving signal output terminal, and a drain of the third transistor is electrically connected to the first voltage level;

the second pull-down circuit comprises a fourth transistor, a source of the fourth transistor is electrically connected to the drain of the first transistor, and a drain of the fourth transistor is electrically connected to the first voltage level;

a terminal of the second capacitor is electrically connected to the first voltage level, and another terminal of the second capacitor is electrically connected to the gate of the third transistor and the gate of the fourth transistor.

6. The liquid crystal display device as claimed in claim 5, wherein the pull-down control circuit comprises:

a fifth transistor, a gate of the fifth transistor being electrically connected to receive the preceding-stage gate driving signal, a source of the fifth transistor being electrically connected to the first voltage level, and a drain of the fifth transistor being electrically connected to the gate of the third transistor and the gate of the fourth transistor;

a sixth transistor, a gate of the sixth transistor being electrically connected to receive the preceding-stage gate driving signal, and a source of the sixth transistor being electrically connected to the first voltage level;

a seventh transistor, a gate of the seventh transistor being electrically connected to a drain of the sixth transistor, a source of the seventh transistor being electrically connected to the second voltage level, and a drain of the seventh transistor being electrically connected to the drain of the fifth transistor;

a third capacitor, electrically connected between the source and the gate of the seventh transistor;

an eighth transistor, a gate and a drain of the eighth transistor being electrically connected to the second voltage level, and a source of the eighth transistor being electrically connected to the drain of the sixth transistor.

7. The liquid crystal display device as claimed in claim 6, wherein the first voltage level is a high voltage level, and the second voltage level is a low voltage level.

8. The liquid crystal display device as claimed in claim 7, wherein the first transistor, the second transistor, the third transistor, the fourth transistor, the fifth transistor, the sixth transistor, the seventh transistor and the eighth transistor all are P-type MOS transistors.

* * * * *